United States Patent [19]

Melzner et al.

[11] Patent Number: 5,731,218
[45] Date of Patent: Mar. 24, 1998

[54] METHOD FOR PRODUCING A CONTACT HOLE TO A DOPED REGION

[75] Inventors: Hanno Melzner, Grosshelfendorf, Germany; Helmut Joswig, Burlington; Wolfgang Müller, Bolton Valley, both of Vt.

[73] Assignee: Siemens Aktiengesellschaft, Munich, Germany

[21] Appl. No.: 769,311

[22] Filed: Dec. 19, 1996

Related U.S. Application Data

[63] Continuation-in-part of Ser. No. 333,517, Nov. 2, 1994, abandoned.

[30] Foreign Application Priority Data

Nov. 2, 1993 [DE] Germany ............... 43 37 355.0

[51] Int. Cl.$^6$ .................. H01L 21/265; H01L 21/44; H01L 21/469; H01L 21/70
[52] U.S. Cl. .................. 437/46; 437/52; 437/186; 437/228; 437/233
[58] Field of Search .................. 437/46, 52, 186, 437/228 E, 233

[56] References Cited

U.S. PATENT DOCUMENTS

| | | |
|---|---|---|
| 4,231,820 | 11/1980 | Henry . |
| 4,549,340 | 10/1985 | Nagasawa et al. . |
| 4,573,257 | 3/1986 | Hulseweh . |
| 4,640,820 | 2/1987 | Thomas et al. . |
| 4,717,677 | 1/1988 | McLaughlin et al. . |
| 4,729,969 | 3/1988 | Suda et al. . |
| 5,166,088 | 11/1992 | Ueda et al. . |
| 5,185,294 | 2/1993 | Lam et al. . |
| 5,266,517 | 11/1993 | Smayling et al. . |
| 5,275,972 | 1/1994 | Ogawa et al. . |
| 5,466,636 | 11/1995 | Cronin et al. ............... 437/233 |

FOREIGN PATENT DOCUMENTS

| | | |
|---|---|---|
| 0 319 215 | 6/1989 | European Pat. Off. . |
| 0 529 717 | 3/1993 | European Pat. Off. . |
| 0 543 158 | 5/1993 | European Pat. Off. . |
| 0 567 815 | 11/1993 | European Pat. Off. . |

OTHER PUBLICATIONS

Motorola Inc, Technical Developments Publ., vol. 12, Apr. 1991, "An Alignment–Tolerant Contact Process . . . ".

IBM Technical Disclosure Bulletin vol. 19, No. 8, Jan. 1987, p. 3423, "Diffusion Defined Bridge Contact".

IBM Technical Disclosure Bulletin vol. 34, No. 3, Aug. 1991, pp. 42–43, "Silicided Source/Drain Process for MOS-FET".

Journal De Physique Publ. C4, Sep. 1988, pp. 504–506, "A Self Aligned Contact Process with Improved . . . ".

Electromechanical Society Publ. vol. 139, No. 8, Aug. 1992, pp. 2318–2322, "A Stacked Capacitor Cell with a . . . ".

*Primary Examiner*—Brian Dutton
*Attorney, Agent, or Firm*—Herbert L. Lerner; Laurence A. Greenberg

[57] ABSTRACT

A method for producing a contact hole to a first doped region of a first conductivity type in a semiconductor wafer having doped regions of the first and of a second conductivity type, includes producing a first doped region in a substrate having a surface, and bounding the first doped region with insulation regions at least at the surface of the substrate. A diffusion barrier layer is produced leaving at least the first doped region free and covering a second doped region of a second conductivity type. An undoped silicon layer is deposited over the entire surface. A doped region is selectively produced in the silicon layer by implantation, and the doped region overlaps a region for a contact hole. Undoped portions of the silicon layer are selectively removed relative to the doped region. An insulation layer is produced over the entire surface. A contact hole is opened in the insulation layer by selective anisotropic etching relative to the doped region of the silicon layer.

11 Claims, 2 Drawing Sheets

METHOD FOR PRODUCING A CONTACT HOLE TO A DOPED REGION

This application is a continuation-in-part of U.S. application Ser. No. 08/333,517, filed Nov. 2, 1994, now abandoned.

BACKGROUND OF THE INVENTION

1. Field of the Invention

The invention relates to a method for producing a contact hole to a doped region in a substrate.

In microelectronics, in order to save space and to increase the safety of the process, so-called self-adjusted contacts are often used. A self-adjusting contact is distinguished by the fact that an electrical contact is made only to a certain conductive region of the circuit, for instance to the source region of a transistor, even if an opening in a photoresist masking layer which is typically used to produce the contact, for instance, is larger and overlaps other conductive regions, such as the transistor gate. That offers the advantage of preventing a short circuit to non-contacting regions from being made regardless of the precise size and location of the opening in the masking layer. In the first place, that obviously increases the process safety. In the second place, in the construction of the circuit, safety margins that otherwise would have to be provided between the contact and conductive regions which are not to be contacted can be dispensed with, which makes for a saving of space.

That is especially important in memory cells, such as DRAMs, since on the one hand the typically necessary safety margins then represent a significant portion of the cell raster, and on the other hand the chip area in such products is a definitive factor in terms of economy. In DRAMs, self-adjusted contacts are preferably used for the bit lne contacts, that is for connecting the bit line to an S/D region of the MOS transistor of a memory cell. The following concepts for producing self-adjusted contacts are known (in each case, the first step is that of the gates being insulated on top by means of a dielectric layer being structured in common with the gate and on the side by means of so-called spacers):

Incorporation of a thin layer of silicon nitride prior to the deposition of a thick insulating, planarizing oxide. The contact is wet-etched with a solution of hydrofluoric acid, and the nitride layer acts as an etching resist. Next, the thin nitride layer is etched and the etching can be kept brief enough to ensure that the encapsulation of the gates is preserved. Moreover, the field oxide present outside the active regions is also not removed excessively, so that the contact can also be made in self-adjusted fashion through field oxide edges. One disadvantage of that process is the isotropic wet etching of the contact, which no longer allows it to be used with smaller structure sizes.

In that case, a polysilicon layer can be used as the etching resist layer, since anisotropic oxide etchants are known that only attack polysilicon a little. However, that polysilicon layer must be removed during or after the production of the contacts, converted into a dielectric or insulated, since a continuous polysilicon layer between the contacts would afford a path for leaking current. Various methods for converting or insulating the polysilicon layer are known. One disadvantage of all of those methods is that they are inconvenient to carry out and are vulnerable to mistakes.

Another disadvantage of all of those methods is the fact that contacts to conductive regions in the substrate must be made by a different procedure, and therefore with a different masking plane, than those leading to the gate. Depending on the procedure, that makes carrying out the process in the ensuing metallizing plane inconvenient, and carries additional risks as well (contamination of the resist in already-opened contact holes, mistakes in adjusting the two types of contacts to one another).

SUMMARY OF THE INVENTION

It is accordingly an object of the invention to provide a method for producing a contact hole to a doped region, which overcomes the hereinafore-mentioned disadvantages of the heretofore-known methods of this general type and which provides a contact hole to a doped region of one conductivity type, in a wafer having doped regions of first and second conductivity types.

With the foregoing and other objects in view there is provided, in accordance with the invention, a method for producing a contact hole to a first doped region of a first conductivity type in a semiconductor substrate having doped regions of the first conductivity type, doped regions of a second conductivity type and a surface, the method which comprises producing a well in an area of a second conductivity type in a substrate having a surface; producing a first doped region in the well; producing a diffusion barrier layer on the surface leaving at least the first doped region uncovered and covering a second doped region of the second conductivity type; depositing an undoped silicon layer on the surface; applying an implantation mask formed with an opening which overlaps the first doped region at least partially, and producing a doped region in the silicon layer by implantation through the opening in the implantation mask, wherein the doped region in the silicon layer overlaps a region for the contact hole to the first doped region; removing undoped portions of the silicon layer; producing an insulation layer on the surface; and opening a contact hole in the insulation layer by anisotropically the insulation layer using doped region of the silicon layer as an etchstop layer.

In accordance with another mode of the invention, there is provided a method wherein the substrate is produced from monocrystalline silicon.

In accordance with a further mode of the invention, there is provided a method wherein the silicon layer is produced from polysilicon.

In accordance with an added mode of the invention, there is provided a method wherein the undoped portions of the silicon layer are removed by wet-chemical etching.

In accordance with an additional mode of the invention, there is provided a method wherein the barrier layer is produced from silicon nitride.

In accordance with yet another mode of the invention, there is provided a method wherein exposed portions of the barrier layer are removed prior to producing the insulation layer.

In accordance with yet a further mode of the invention, there is provided a method wherein he doped region of the silicon layer is produced as a p-doped region, and undoped portions of the silicon layer are removed by wet-chemical etching with a potassium hydroxide solution.

In accordance with yet an added mode of the invention, there is provided a method wherein a boron concentration of between $10^{19}$ cm–3 and $10^{21}$ cm–3 is established in the doped region of the silicon layer.

In accordance with yet an additional mode of the invention, there is provided a method wherein the doped region in the substrate is produced as a source-drain region of an MOS transistor having a gate electrode; and producing lateral surface insulating coverings and insulating cover layers of the gate electrode of the MOS transistor, as parts of the insulation regions.

In accordance with again another mode of the invention, there is provided a method which further comprises opening a further contact hole to the gate electrode simultaneously with an opening of the contact hole to the doped region.

In accordance with a concomitant mode of the invention, there is provided a method which comprises producing the MOS transistor as a selection transistor of a memory cell including a memory capacitor having an electrode, and connecting the electrode of the memory capacitor to a further doped region of the MOS transistor through a doped polysilicon structure.

The method according to the invention exploits the fact that undoped silicon can be removed selectively relative to doped silicon. In the region where the contact will later be made, the undoped silicon layer which, for instance, is polycrystalline, is doped selectively by means of ion implantation, using a mask. A diffusion barrier layer, which leaves at least the first doped region free and covers a second doped region of the opposite conductivity type, is disposed beneath the silicon layer and prevents undesired diffusion of dopants at other locations, for instance from oppositely doped substrate regions, into the silicon layer, particularly in an ensuing temperature stabilization operation. Next, the undoped portion of the silicon layer is removed selectively relative to the doped region. An insulation layer is produced over the entire surface, and in it the contact hole is opened by selective anisotropic etching relative to the doped region in the silicon layer. The doped region in the silicon layer acts as an etching resist and is no longer removed.

It is advantageous to produce the silicon layer in such a way that at least in the doped region it is formed of polysilicon, since silicon oxide, which the insulation layer substantially contains as a rule, is etchable with high selectivity relative to polysilicon.

The problematic subsequent oxidation of the silicon layer required in the prior art is dispensed with, since the undoped portions of the silicon layer are removed outside the contact hole.

Other features which are considered as characteristic for the invention are set forth in the appended claims. Although the invention is illustrated and described herein as embodied in a method for producing a contact hole to a doped region, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
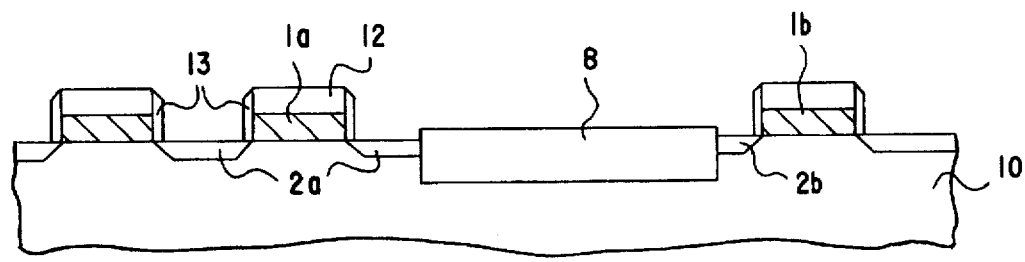
FIGS. 1-5 are fragmentary, diagrammatic, cross-sectional views of a semiconductor substrate with an MOS transistor, with which the method steps are described below as an example of the invention.

Referring now to the figures of the drawing in detail and first, particularly, to FIG. 1 thereof, it is seen that located in or on a p-type silicon semiconductor substrate 10 is an MOS transistor having a gate 1a and two S/D (source/drain) regions 2a in the form of p-doped regions which are arranged in a n-well 11 in the substrate. A further MOS transistor with a gate 1b and n-doped regions 2b is separated from the first-mentioned transistor by means of an insulation region 8, such as a field oxide. As is described above, the gates 1a and 1b are insulated at the top and at the side by respective gate encapsulations or insulating regions or cover layers 12 and 13. The source and drain regions 2a, 2b are doped as usual. The process can be especially advantageously used for self-adjusted contacts on the p-doped regions 2a. In other words, the doping is typically performed with boron in this case.

Figure 2:
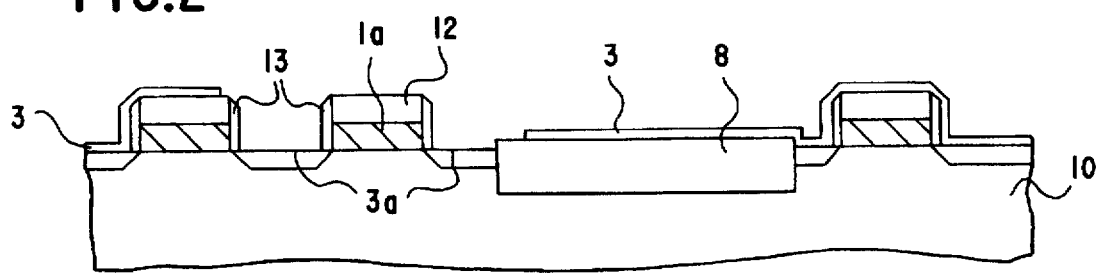

Next, according to FIG. 2, a thin barrier layer 3, for instance silicon nitride, is deposited. At locations 3a where self-adjusted contacts are to be made later, this layer 3 is opened by means of an etching process, using a photomask. The etching of the barrier layer 3 can be kept brief, so that the gate encapsulations 12, 13 are preserved.

Figure 3:
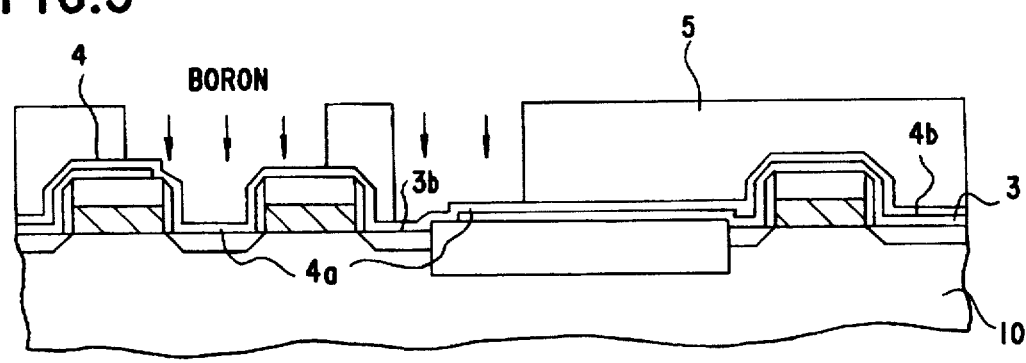

As is seen in FIG. 3, a polysilicon layer 4 is next deposited. Through the use of a further photomask 5, the polysilicon layer is implanted with a suitable dopant, in this case boron in particular, at locations 4a at which a self-adjusted contact is intended to be made. The boron-implanted region 4a should preferably be made somewhat larger than the later contact hole. The implantation is carried out at such low energy that practically the entire dose is deposited in the polysilicon layer 4. Through the use of a temperature stabilization operation, the boron is distributed in the polysilicon layer 4 and electrically activated. The boron doping is chosen as a function of the etching process which is performed later and as a function of the selectivity of undoped to doped polysilicon of the process, and it amounts among other possibilities to more than $10^{19}$ cm$^{-3}$, and preferably approximately $10^{20}$ cm$^{-3}$. The underlying barrier layer 3 prevents the diffusion of dopant into the polysilicon layer 4 at locations lacking a self-adjusting contact, in particular at n-doped locations 4b.

Figure 4:
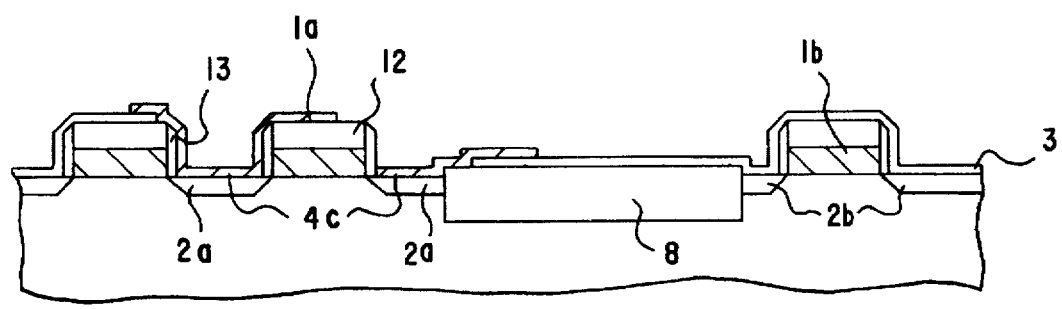

After removal of the photomask 5, undoped polysilicon can be etched selectively relative to the doped polysilicon, for instance by means of a OH solution, as is seen in FIG. 4. Through the use of such etching, the polysilicon is removed wherever it contains no boron or only very little boron. Depending on the implantation conditions, the vertical portion of the polysilicon layer is possibly not so highly doped, so that it is removed by the etching. This is not a problem, since when the contacts are later made, anisotropic etching is employed, and thus no etching resist is needed at the vertical lateral surfaces of the gates. The underlying barrier layer 3 prevents an attack of the substrate in the OH etching at locations lacking a self-adjusted contact, in particular in the n-doped regions 2b. The openings in this layer above the p-doped regions 3a, depending on the requirements of the structure, can be covered completely by the implanted zone 4a or can overlap it. Additionally, at these overlapping locations 3b, etching of the substrate does not occur, because in this case the polysilicon layer 4 is doped by boron that diffuses out of the S/D region 2a and thus is etch-resistant.

At the location of the later self-adjusted contact, or in other words on the doped region, doped polysilicon pads 4c are then produced, which are in electrical contact with the doped region 2a through the openings 3a in the barrier layer.

Figure 5:
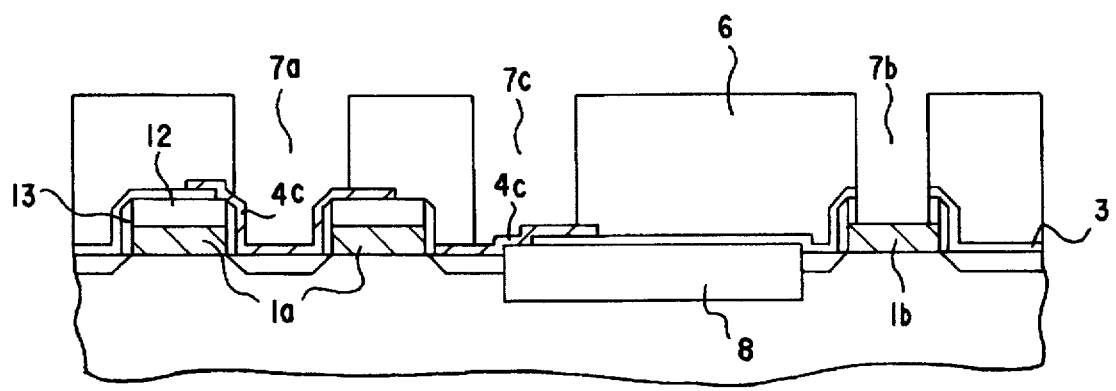

FIG. 5 shows that the barrier layer 3 can then be optionally removed by a brief full-surface etching at the exposed locations. In each case, a thick dielectric 6, as a rule a silicon oxide, is then applied for the sake of insulation and planarization. The contact holes both to the substrate and to the gate are made in this dielectric, with a contact hole mask and with anisotropic dry oxide etching. Located under each of the self-adjusted contemplated contacts 7a is a polysilicon pad 4c (which is a "boron implanted polysilicon pad" or BIPP) that is insulated from all of the other pads and that has been made large enough to ensure that the hole mask does not overlap the pad as described, even in the worst possible case of maladjustment. If the contact hole mask at such a location should overlap a gate 1a, then the etch stops at this pad 4c, and therefore the dielectric gate encapsulation 12, 13 is preserved, and no short circuit to the gate 1a is produced. At locations where a contact 7b to the gate 1b is contemplated, there is no pad. In this case, the contact hole etching opens the gate 1b, so that an electrical contact can be made. With the same process sequence, contact holes 7c that partly overlap the field oxide 8 or are even disposed entirely above the field oxide can also be produced. Moreover, all of the non-self-adjusted contacts to the substrate, particularly those on n-doped region 2b, can be produced simultaneously. In that case, there is no pad located under the contact. The later metallizing process is carried out as usual (with or without filling of the contact holes). This method can be especially advantageously employed in a memory cell that has a so-called BOSS strap (for boron out-diffused surface strap), as is described in Published European Application No. 543 158. In a DRAM memory cell, this strap connects the drain region of the transistor to a capacitor electrode, such as polysilicon filling disposed in the interior of the capacitor trench. Most of the above-described layer depositions, photo-techniques and other process steps are already employed in the production process for a BOSS strap of this kind. Only the following process steps are added in order to carry out the method of the invention:

a photo-technique to define the BIPP pads;
the implantation; and
the resist stripping process.

In the method described in Published European Application No. 543 158, these process steps are logically introduced after the deposition of the polysilicon and prior to the temperature stabilization. The entire content of the aforementioned patent disclosure may be referred to for further details.

One special advantage of combining the invention with the BOSS process is that impairment or alteration of the basic process performance (transistor data, leakage currents, etc.) is as good as precluded, since hardly any new process steps have to be added. In particular, the temperature stress remains unchanged, since the temperature stabilization required for activating the implanted boron is already included in the BOSS process. When the process according to the invention is used, re-optimization of the basic process is therefore unnecessary.

In construction as well, the method of the invention can be combined simply and logically with the BOSS process.

The BOSS strap is self-adjusted to the gates, since only in the region between the gates is the polysilicon in contact with the boron-doped substrate (and with the trench filling), and accordingly only in this case is it edge-resistant from out-diffusion. It is thus very easily possible to integrate an adequately large BIPP pad into the cell. The only peripheral condition is that the BIPP pad must not overlap the gate edge remote from the contact. As can easily be appreciated, this peripheral condition can readily be met, especially when the cell transistor, as it usually is, is markedly longer than the minimum draft rule of the design in order to reduce sub-threshold voltage leakage currents. In that case, the gate in the region in question is relatively wide, which affords especially wide freedom in terms of the specific embodiment of the boron-implanted polysilicon pad. Specifically, the following adaptations must be made in the construction:

Optional: Removal of the safety margin between the contact and gate, and adaptation of all of the planes to the reduced word line raster. This provision is not necessary if the goal is merely to increase process safety without saving space.

Modification of the mask for structuring the thin dielectric layer under the polysilicon: additional opening in the region of the bit line contact.

Incorporation of the boron-implanted polysilicon pad.

Optional: Increasing the size of the contact hole, to increase process safety.

Optional: Use of the contact according to the invention in other p-doped regions as well, for instance in raster circuits, for saving even more space.

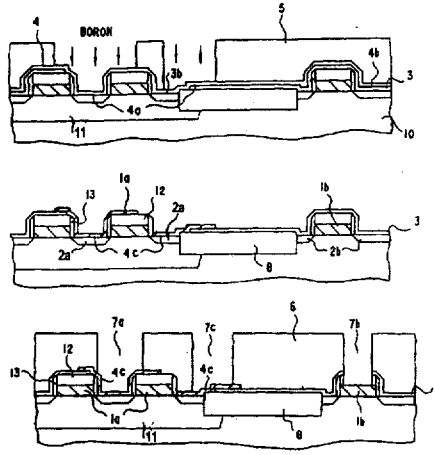

We claim:

1. A method for producing a contact hole to a first doped region of a first conductivity type in a semiconductor substrate having doped regions of the first conductivity type, doped regions of a second conductivity type, and a surface, the method which comprises:

producing a well in an area of the second conductivity type in a substrate having a surface;

producing a first doped region in the well;

producing a diffusion barrier layer on the surface leaving at least the first doped region uncovered and covering a second doped region of the second conductivity type;

depositing an undoped silicon layer on the surface;

applying an implantation mask formed with an opening which overlaps the first doped region at least partially, and producing a doped region in the silicon layer by implantation through the opening in the implantation mask, wherein the doped region in the silicon layer overlaps a region for a contact hole to the first doped region;

removing undoped portions of the silicon layer;

producing an insulation layer on the surface; and opening the contact hole in the insulation layer by anisotropically etching the insulation layer using the doped region of the silicon layer as an etchstop layer.

2. The method according to claim 1, wherein the substrate is produced from monocrystalline silicon.

3. The method according to claim 1, wherein the silicon layer is produced from polysilicon.

4. The method according to claim 1, wherein the undoped portions of the silicon layer are removed by wet-chemical etching.

5. The method according to claim 1, wherein the barrier layer is produced from silicon nitride.

6. The method according to claim 1, wherein exposed portions of the barrier layer are removed prior to producing the insulation layer.

7. The method according to claim 1, wherein the doped region of the silicon layer is produced as a p-doped region, and undoped portions of the silicon layer are removed by wet-chemical etching with a potassium hydroxide solution.

8. The method according to claim 7, wherein a boron concentration of between $10^{19}$ cm$^{-3}$ and $10^{21}$ cm$^{-3}$ is established in the doped region of the silicon layer.

9. The method according to claim 1, wherein the doped region in the substrate is produced as a source-drain region of an MOS transistor having a gate electrode; and producing lateral surface insulating coverings and insulating cover layers of the gate electrode of the MOS transistor, as parts of the insulation regions.

10. The method according to claim 9, which further comprises opening a further contact hole to the gate electrode simultaneously with the opening of the contact hole to a doped region.

11. The method according to claim 9, which comprises producing the MOS transistor as a selection transistor of a memory cell including a memory capacitor having an electrode, and connecting the electrode of the memory capacitor to a further doped region of the MOS transistor through a doped polysilicon structure.

* * * * *

UNITED STATES PATENT AND TRADEMARK OFFICE
CERTIFICATE OF CORRECTION

PATENT NO.    : 5,731,218
DATED         : March 24, 1998
INVENTOR(S)   : Hanno Melzner et al.

It is certified that error appears in the above-identified patent and that said Letters Patent is hereby corrected as shown below:

Title page,
The title page showing the illustrative figure should be deleted and substitute therefore the attached title page.
Item [22], Filed, should read as follows:
-- [22] Filed: Dec. 18, 1996 --.

Drawings,
Figure 1-5 should be deleted and substitute therefore the corrected Figure 1-5, as shown on the attached page.

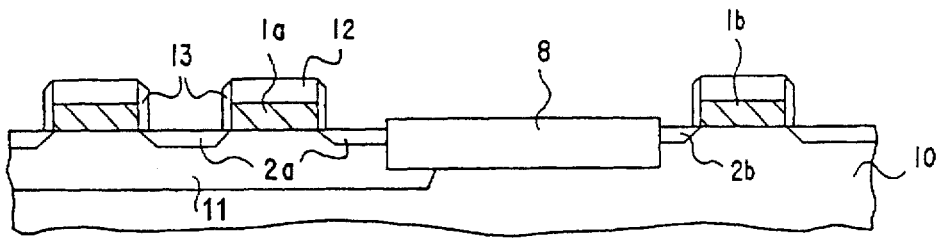

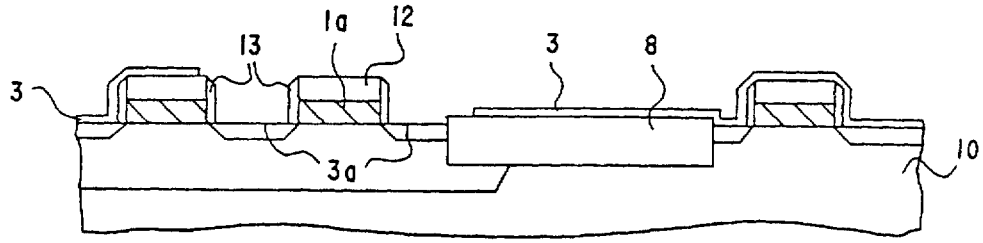

UNITED STATES PATENT AND TRADEMARK OFFICE
CERTIFICATE OF CORRECTION

PATENT NO.   : 5,731,218
DATED         : March 24, 1998
INVENTOR(S) : Hanno Melzner et al.

It is certified that error appears in the above-identified patent and that said Letters Patent is hereby corrected as shown below:

FIG.3

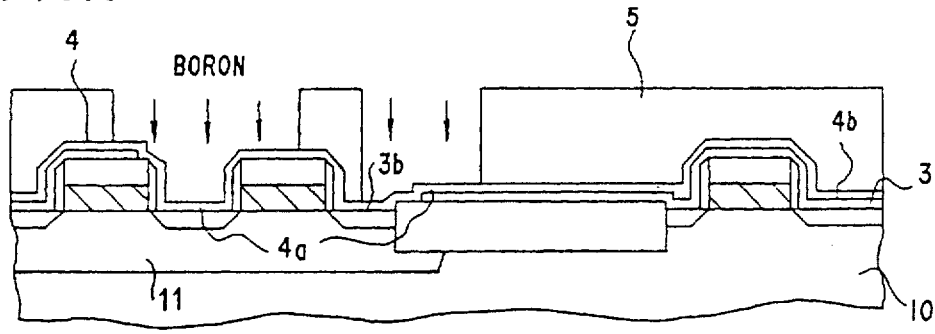

FIG.4

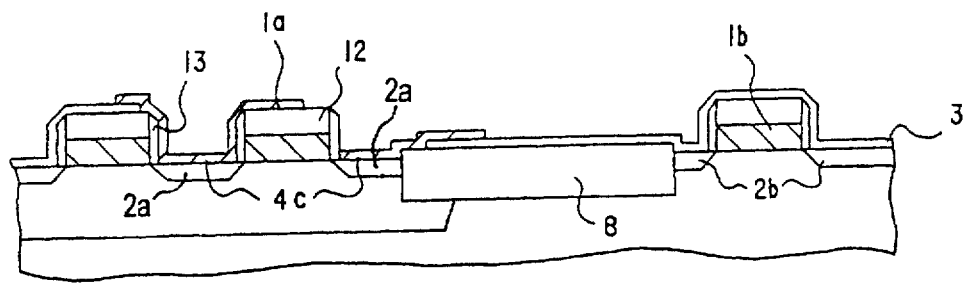

UNITED STATES PATENT AND TRADEMARK OFFICE
CERTIFICATE OF CORRECTION

PATENT NO. : 5,731,218
DATED : March 24, 1998
INVENTOR(S) : Hanno Melzner et al.

It is certified that error appears in the above-identified patent and that said Letters Patent is hereby corrected as shown below:

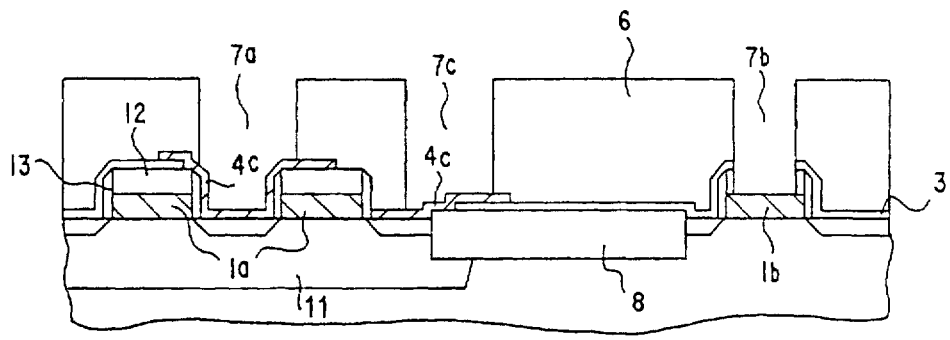

FIG.5

Signed and Sealed this

Fourteenth Day of May, 2002

Attest:

*Attesting Officer*

JAMES E. ROGAN
*Director of the United States Patent and Trademark Office*

United States Patent [19]
Melzner et al.

[11] Patent Number: 5,731,218
[45] Date of Patent: Mar. 24, 1998

[54] METHOD FOR PRODUCING A CONTACT HOLE TO A DOPED REGION

[75] Inventors: Hanno Melzner, Grosshelfendorf, Germany; Helmut Joswig, Burlington; Wolfgang Müller, Bolton Valley, both of Vt.

[73] Assignee: Siemens Aktiengesellschaft, Munich, Germany

[21] Appl. No.: 769,311

[22] Filed: Dec. 19, 1996

Related U.S. Application Data

[63] Continuation-in-part of Ser. No. 333,517, Nov. 2, 1994, abandoned.

[30] Foreign Application Priority Data

Nov. 2, 1993 [DE] Germany .................. 43 37 355.0

[51] Int. Cl.⁶ .................. H01L 21/265; H01L 21/44; H01L 21/469; H01L 21/70
[52] U.S. Cl. .................. 437/46; 437/52; 437/186; 437/228; 437/233
[58] Field of Search .................. 437/46, 52, 186, 437/228 E, 233

[56] References Cited

U.S. PATENT DOCUMENTS

| | | |
|---|---|---|
| 4,231,820 | 11/1980 | Henry . |
| 4,549,340 | 10/1985 | Nagasawa et al. . |
| 4,573,257 | 3/1986 | Hulseweh . |
| 4,640,820 | 2/1987 | Thomas et al. . |
| 4,717,677 | 1/1988 | McLaughlin et al. . |
| 4,729,969 | 3/1988 | Suda et al. . |
| 5,166,088 | 11/1992 | Ueda et al. . |
| 5,185,294 | 2/1993 | Lam et al. . |
| 5,266,517 | 11/1993 | Smayling et al. . |
| 5,275,972 | 1/1994 | Ogawa et al. . |
| 5,466,636 | 11/1995 | Cronin et al. .................. 437/233 |

FOREIGN PATENT DOCUMENTS

| | | |
|---|---|---|
| 0 319 215 | 6/1989 | European Pat. Off. . |
| 0 529 717 | 3/1993 | European Pat. Off. . |
| 0 543 158 | 5/1993 | European Pat. Off. . |
| 0 567 815 | 11/1993 | European Pat. Off. . |

OTHER PUBLICATIONS

Motorola Inc. Technical Developments Publ., vol. 12, Apr. 1991, "An Alignment-Tolerant Contact Process . . . ".
IBM Technical Disclosure Bulletin vol. 19, No. 8, Jan. 1987, p. 3423, "Diffusion Defined Bridge Contact".
IBM Technical Disclosure Bulletin vol. 34, No. 3, Aug. 1991, pp. 42–43, "Silicided Source/Drain Process for MOSFET".
Journal De Physique Publ. C4, Sep. 1988, pp. 504–506, "A Self Aligned Contact Process with Improved . . . ".
Electromechanical Society Publ. vol. 139, No. 8, Aug. 1992, pp. 2318–2322, "A Stacked Capacitor Cell with a . . . ".

*Primary Examiner*—Brian Dutton
*Attorney, Agent, or Firm*—Herbert L. Lerner; Laurence A. Greenberg

[57] ABSTRACT

A method for producing a contact hole to a first doped region of a first conductivity type in a semiconductor wafer having doped regions of the first and of a second conductivity type, includes producing a first doped region in a substrate having a surface, and bounding the first doped region with insulation regions at least at the surface of the substrate. A diffusion barrier layer is produced leaving at least the first doped region free and covering a second doped region of a second conductivity type. An undoped silicon layer is deposited over the entire surface. A doped region is selectively produced in the silicon layer by implantation, and the doped region overlaps a region for a contact hole. Undoped portions of the silicon layer are selectively removed relative to the doped region. An insulation layer is produced over the entire surface. A contact hole is opened in the insulation layer by selective anisotropic etching relative to the doped region of the silicon layer.

11 Claims, 2 Drawing Sheets